United States Patent
Meyer et al.

(10) Patent No.: US 12,420,563 B2
(45) Date of Patent: Sep. 23, 2025

(54) LIGHT SOURCE HAVING AT LEAST ONE FIRST LIGHT-EMITTING SEMICONDUCTOR COMPONENT, A FIRST CARRIER ELEMENT AND A DISTRIBUTING ELEMENT

(71) Applicant: Excelitas Noblelight GmbH, Hanau (DE)

(72) Inventors: Stefan Meyer, Hanau (DE); Jochen Grade, Hanau (DE); Nico Peifer, Hanau (DE); Andreas Stahl, Frankfurt am Main (DE); Janek Desgronte, Hanau (DE)

(73) Assignee: Excelitas Noblelight GmbH, Hanau (DE)

( * ) Notice: Subject to any disclaimer, the term of this patent is extended or adjusted under 35 U.S.C. 154(b) by 71 days.

(21) Appl. No.: 17/422,892

(22) PCT Filed: Jan. 14, 2020

(86) PCT No.: PCT/EP2020/050826
§ 371 (c)(1),
(2) Date: Jul. 14, 2021

(87) PCT Pub. No.: WO2020/148289
PCT Pub. Date: Jul. 23, 2020

(65) Prior Publication Data
US 2022/0072871 A1    Mar. 10, 2022

(30) Foreign Application Priority Data
Jan. 16, 2019  (DE) .......................... 102019200478.4

(51) Int. Cl.
*B41J 2/01*    (2006.01)
*B41J 2/45*    (2006.01)
(Continued)

(52) U.S. Cl.
CPC . *B41J 2/45* (2013.01); *B41J 2/01* (2013.01); *B41J 11/0021* (2021.01);
(Continued)

(58) Field of Classification Search
CPC ................................. B41J 2/01; B41J 11/0021
See application file for complete search history.

(56) References Cited

U.S. PATENT DOCUMENTS

| 8,534,824 B2 | 9/2013 | Roof et al. |
| 2007/0084585 A1 | 4/2007 | Takagi et al. |

(Continued)

FOREIGN PATENT DOCUMENTS

| CN | 108351092 A | 7/2018 |
| DE | 102006016529 A1 | 10/2007 |

(Continued)

OTHER PUBLICATIONS

Herbst et al., "Industrial Organic Pigments, Production, Properties, Applications", Third Edition, Copyright 2004, pp. 1-672.
(Continued)

*Primary Examiner* — Douglas X Rodriguez
*Assistant Examiner* — Kendrick X Liu
(74) *Attorney, Agent, or Firm* — Wolf, Greenfield & Sacks, P.C.

(57) ABSTRACT

A light source. The light source includes as components which superimpose one another in this sequence: a first light-emitting semiconductor component; a first carrier element comprising a first carrier surface which faces the first light-emitting semiconductor component and a first cooling surface deliminating at least in part a first fluid path; and a distributor element comprising a first cavity and a further cavity. The first cavity and the further cavity are fluidically connected to one another by the first fluid path. Also disclosed are a printing machine; methods, in particular for (Continued)

producing a printed product, for irradiating a material to be irradiated, and for producing a light source; corresponding method products; an assembly having the light source; and uses of the light source.

18 Claims, 11 Drawing Sheets

(51) Int. Cl.
  *B41J 11/00* (2006.01)
  *H01L 25/075* (2006.01)
  *H10H 20/01* (2025.01)
  *H10H 20/858* (2025.01)

(52) U.S. Cl.
  CPC ..... *H01L 25/0753* (2013.01); *H10H 20/0365* (2025.01); *H10H 20/8582* (2025.01); *H10H 20/8586* (2025.01)

(56) References Cited

U.S. PATENT DOCUMENTS

| | | | |
|---|---|---|---|
| 2008/0062694 A1* | 3/2008 | Lai | F28D 1/0478 362/294 |
| 2009/0039380 A1 | 2/2009 | Inui et al. | |
| 2009/0059594 A1 | 3/2009 | Lin | |
| 2011/0037390 A1 | 2/2011 | Ko et al. | |
| 2012/0062667 A1 | 3/2012 | Roof et al. | |
| 2012/0145355 A1* | 6/2012 | Schreir-Alt | F28F 3/12 165/104.19 |
| 2012/0279761 A1* | 11/2012 | Hori | H01L 23/3735 228/122.1 |
| 2015/0343795 A1* | 12/2015 | Uchida | F21V 29/51 347/102 |
| 2017/0097150 A1* | 4/2017 | Chen | F26B 3/28 |
| 2019/0128511 A1* | 5/2019 | Watanabe | F21V 29/83 |
| 2021/0229476 A1* | 7/2021 | Mima | F21V 29/67 |

FOREIGN PATENT DOCUMENTS

| | | |
|---|---|---|
| DE | 102011082317 A1 | 4/2012 |
| JP | 2005079065 A | 3/2005 |
| JP | 2006019676 A | 1/2006 |
| JP | 2009065127 A | 3/2009 |
| JP | 2011165509 A | 8/2011 |
| JP | 2015060745 A | 3/2015 |
| JP | 2015-072747 A | 4/2015 |
| JP | 2017091945 A | 5/2017 |
| WO | 20170008042 | 1/2017 |
| WO | 20170062894 | 4/2017 |

OTHER PUBLICATIONS

International Search Report and Written Opinion dated Mar. 18, 2020 for corresponding International Patent Application No. PCT/EP2020/050826.

Office Action issued Aug. 4, 2022 in JP Application No. 2021-541162.

International Preliminary Report on Patentability for International Application No. PCT/EP2020/050826 mailed Jul. 29, 2021.

* cited by examiner

100

600

800

900

1100

LIGHT SOURCE HAVING AT LEAST ONE FIRST LIGHT-EMITTING SEMICONDUCTOR COMPONENT, A FIRST CARRIER ELEMENT AND A DISTRIBUTING ELEMENT

CROSS REFERENCE TO RELATED APPLICATIONS

This application is a U.S. national phase filing of International Patent Application Number PCT/EP2020/050826 filed on Jan. 14, 2020, which claims priority to German Patent Application Number 102019200478.4 filed on Jan. 16, 2019. The disclosures of these applications are hereby incorporated by reference in their entirety.

TECHNICAL FIELD

The present invention relates to a light source; to a printing machine; to methods, in particular for producing a printed product, for irradiating a material to be irradiated and for producing a light source and to corresponding products; to an assembly having the light source; and to uses of the light source.

BACKGROUND OF THE DISCLOSURE

In the technical field of the invention, the printing industry, the use of light sources for curing printing inks and varnishes has been known for a long time. Furthermore known is the use of UV-curable inks and varnishes, thus inks and varnishes which can be cured by irradiation with suitable UV radiation. Mercury vapor lamps are conventionally used for curing such inks and varnishes. However, these light sources have significant disadvantages in terms of their service life, maintenance intensity and heat generation. This has already been recognized in the prior art. Consequently, light-emitting semiconductor components, in particular light-emitting diode modules (LED modules) are increasingly used instead of mercury vapor lamps for irradiating UV-curable inks and varnishes. While the use of light-emitting diodes offers many advantages in comparison to the well-known mercury vapor lamps, there is still room for improvement in terms of the design of light sources with light-emitting diodes, particularly but not exclusively with UV-LEDs. High-performance light-emitting diodes which, despite the typically significantly higher efficiency of light-emitting diodes in comparison to vapor lamps, generate waste heat that has to be discharged are thus often used in the printing industry. The efficiency of the light-emitting diodes is significantly decreased if the waste heat is not discharged to a sufficient extent. Moreover, the service life of the light-emitting diodes may be shortened. In the absence of sufficient cooling of light-emitting diodes, substantial advantages of light-emitting diodes in comparison to vapor lamps are thus lost. This has to be prevented not only for individual light-emitting diodes but ideally across all light-emitting diodes of a light source. To this end, ideally all light-emitting diodes of a light source, which may have a length on the order of meters, have to be cooled in an ideally homogeneous manner. Various measures for meeting this objective are known in the prior art.

A light-emitting diode module that comprises a support which is obtained by extrusion molding and on which the light-emitting diode packs of the module, thus the light-emitting diodes that comprise LED chips on a substrate, are assembled is described in WO 2017/008042 A1. The support in its interior has a passage which provides a flow of cooling liquid for cooling the LEDs. Because the cooling is not very efficient in such a construction, a powerful and thus cost-intensive and energy-intensive cooling circuit has to be used in order for the inefficiency to be compensated.

In order for the efficiency of cooling to be increased, supports for LED modules which in the interior thereof not only have a simple passage but a very fine cooling structure of a multiplicity of interconnected micro ducts and macro ducts are furthermore known in the prior art. Such supports are often constructed from a multiplicity of copper layers which have to be tightly connected to one another during production. This special production is very complex and correspondingly expensive. Furthermore, the wall thickness of such supports is rather small. As a result, the delicate cooling structure is not particularly able to bear any mechanical stress so that damage may occur in the event of pressure peaks in the cooling circuit. Damage to the support can occur also when the LEDs are assembled on the support. Furthermore, the special and complex production method results in production tolerances which are excessive for some applications.

SUMMARY OF THE DISCLOSURE

In general, it is an object of the present invention to at least partially overcome one disadvantage which results from the prior art.

It is a further object of the invention to provide a light source for a printing machine, wherein the light source enables in spatial terms ideally homogeneous curing of a printing ink or a varnish across an ideally large area by irradiation with light from light-emitting semiconductor components, in particular light-emitting diodes. According to a further object, the aforementioned curing can take place in an ideally rapid manner. According to a further object of the invention, the light source according to the invention enables the aforementioned curing while using cooling of ideally low complexity, preferably a cooling circuit with an ideally low pressure. A further object of the invention lies in providing a light source for a printing machine, wherein the light source can be adapted in an ideally flexible manner with ideally low complexity to an ink or a varnish to be cured. It is furthermore an object of the invention to provide a light source which is ideally simple to maintain or is able to be retrofitted, or both, for curing an ink or varnish in a printing machine. It is furthermore an object of the invention to provide one of the previously mentioned advantageous light sources, whereby the latter additionally is ideally mechanically stable. This relates in particular to a cooling member of the light source. Furthermore, this light source preferably has an ideally low tendency toward being damaged during its production, in particular when assembling light-emitting semiconductor components on a cooling member, for example by a joining method such as soldering, adhesive bonding or sintering. Furthermore preferably, the light source according to the invention has an ideally low tendency toward being damaged at high pressures in a cooling circuit or in the event of pressure peaks in the cooling circuit for cooling the light-emitting semiconductor components of the light source. A further object of the invention lies in providing a light source for a printing machine, whereby the light source can be produced in an ideally simple and cost-effective way. The light source, in particular a cooling member of the light source, is preferably ideally largely able to be produced while using conventional tools such as, for example, a computer numerical control (CNC) milling machine. It is furthermore an object of the invention to provide one of the previously mentioned advantageous light sources, whereby the light sources can additionally be produced with ideally small production tolerances. It is a further object of the invention to provide one of the previously mentioned advantageous light sources, whereby assembling of the light-emitting semiconductor components on a cooling member during the production of the light source, in particular by soldering or sintering, is ideally simple. A further object of the invention lies in providing a light source for a printing machine, whereby as many components of the light source as possible are ideally readily reusable, in particular recyclable. All of the previously mentioned advantageous light sources are preferably semiconductor light sources.

It is furthermore an object of the invention to provide a printing machine comprising one of the previously described advantageous light sources. Accordingly, this printing machine preferably demonstrates one or a plurality of the advantages previously described in the context of the light source.

It is furthermore an object of the invention to provide a method for producing a light source for a printing machine, the method being distinguished by an advantageous combination of a short production time, a highly stable process, minor wear on the tools, and simple machining of materials used for a cooling member, preferably copper or aluminum.

A contribution toward at least partially achieving at least one, preferably a plurality, of the above objects is made by the disclosed invention.

A contribution toward achieving at least one of the objects according to the invention is made by an embodiment 1 of a first light source comprising as components which superimpose one another in this sequence:
  a) at least one first light-emitting semiconductor component;
  b) a first carrier element comprising
    i) a first carrier surface which faces the at least one first light-emitting semiconductor component, and
    ii) additionally a first cooling surface; and
  c) a distributor element comprising
    i) a first cavity, and
    ii) a further cavity;
wherein the first cavity and the further cavity are fluidically connected to one another by a first fluid path; wherein the first fluid path is at least in part delimited by the first cooling surface. The first fluid path is specifically that fluid path that fluidically connects the first cavity directly to the further cavity. The first fluid path does not comprise exclusively the shortest connection between the first cavity and the further cavity but indeed all paths which are oriented in the same way as the shortest connection, and thus do not lead from the first cavity away from the further cavity. The first fluid path is at least in part delimited by the first cooling surface to the extent that at least part of the first fluid path is delimited by at least part of the first cooling surface. Accordingly, the first cooling surface may also comprise one or a plurality of parts which do not delimit the first fluid path.

In an embodiment 2 according to the invention, the first light source is designed according to the embodiment 1 thereof, wherein the first carrier element is releasably connected to the distributor element, preferably by at least one fastener. A releasable connection between two elements exists when one of the two elements is indirectly or directly connected in a fixed, preferably rigid, manner to the other of the two elements and this connection can be released without damaging or destroying one of the two elements, and in the case of the indirect connection, preferably also without damaging or destroying an intervening element. A preferred fastener is a screw.

In an embodiment 3 according to the invention, the first light source is designed according to the embodiment 1 or 2 thereof, wherein the cooling surface is at least in part a surface of a cooling structure of the first carrier element.

In an embodiment 4 according to the invention, the first light source is designed according to the embodiment 3 thereof, wherein the cooling structure comprises a multiplicity of cooling ribs, the cooling structure preferably being formed by a multiplicity of cooling ribs.

In an embodiment 5 according to the invention, the first light source is designed according to the embodiment 4 thereof, wherein at least part of the cooling ribs of the multiplicity of cooling ribs are in contact with the distributor element. Preferably, each of the cooling ribs of the multiplicity of cooling ribs is in contact with the distributor element.

In an embodiment 6 according to the invention, the first light source is designed according to the embodiment 4 or 5 thereof, wherein the multiplicity of cooling ribs are composed of 3 to 30 cooling ribs, preferably of 5 to 25 cooling ribs, more preferably of 10 to 20 cooling ribs.

In an embodiment 7 according to the invention, the first light-source is designed according to one of the embodiments 4 to 6 thereof, wherein at least part of the cooling ribs of the multiplicity of cooling ribs are elongate along the first fluid path. Preferably, the cooling ribs of the multiplicity of cooling ribs are elongate along the first fluid path. The cooling ribs of the multiplicity of cooling ribs preferably have mutually parallel faces.

In an embodiment 8 according to the invention, the first light source is designed according to one of the embodiments 4 to 7 thereof, wherein the cooling ribs of the multiplicity of cooling ribs have in each case a thickness in a range from 0.2 to 2 mm, preferably from 0.3 to 1.5 mm, more preferably from 0.4 to 1.2 mm, most preferably from 0.5 to 1.0 mm.

In an embodiment 9 according to the invention, the first light source is designed according to one of the embodiments 4 to 8 thereof, wherein two neighboring cooling ribs of the multiplicity of cooling ribs have in each case a spacing in a range from 0.2 to 2 mm, preferably from 0.3 to 1.5 mm, more preferably from 0.5 to 1.2 mm.

In an embodiment 10 according to the invention, the first light source is designed according to one of the embodiments 4 to 9 thereof, wherein the first fluid path comprises a multiplicity of ducts which are routed between two respective neighboring cooling ribs of the multiplicity of cooling ribs. These ducts preferably have in each case a width which is equal to the spacing between two neighboring cooling ribs. The multiplicity of ducts which are routed between two respective neighboring cooling ribs of the multiplicity of cooling ribs is preferably composed of 4 to 31, more preferably 6 to 26, most preferably 11 to 21 ducts. The ducts of the multiplicity of ducts which are routed between two respective neighboring cooling ribs of the multiplicity of cooling ribs are preferable elongate in a transverse direction which is perpendicular to the longitudinal direction. The ducts of the multiplicity of ducts which are routed between two respective neighboring cooling ribs of the multiplicity of cooling ribs preferably run so as to be mutually parallel. The ducts which are routed between two respective neighboring cooling ribs of the multiplicity of cooling ribs preferably have a depth which is at least 3 times the size, more preferably at least 4 times the size, most preferably at least 5 times the size of their width.

In an embodiment 11 according to the invention, the first light source is designed according to one of the embodiments 4 to 10 thereof, wherein the cooling ribs of the multiplicity of cooling ribs comprise in each case a first portion and at least one further portion, wherein the first portions of the cooling ribs are situated in the first fluid path, wherein the further portions of the cooling ribs are not situated in the first fluid path. The further portions preferably contribute toward an ideally positive distribution of a cooling fluid, thus enabling ideally homogeneous cooling of the first carrier element. An interruption of the cooling rib, or a region with a reduced height of the cooling rib, can be situated between the first portion and the at least one further portion of a cooling rib. The first portion of a cooling rib and the at least one further portion of the same cooling rib are preferably disposed beside one another in a direction which is perpendicular to a height of the cooling rib and perpendicular to a thickness of the cooling rib. The aforementioned direction is preferably a direction of a longitudinal extent of the cooling rib. The cooling ribs of the multiplicity of cooling ribs particularly preferably comprise in each case a first portion and at least two, more preferably exactly two, further portions. In the direction which is perpendicular to the height and the thickness of a cooling rib, a further portion of this cooling rib, the first portion, and a further portion of the cooling rib are preferably mutually successive. The first fluid path in portions preferably runs in each case between a further portion of a cooling rib and the first portion of the cooling rib.

In an embodiment 12 according to the invention, the first light source is designed according to the embodiment 11 thereof, wherein the cooling ribs in the at least one further portion thereof have a height which is decreasing in a direction which is perpendicular to the thicknesses and heights of the cooling ribs and directed away from the first portions.

In an embodiment 13 according to the invention, the first light source is designed according to one of the embodiments 3 to 12 thereof, wherein the first fluid path, in the direction from the first cavity toward the further cavity, after the first cavity and ahead of at least part of the cooling structure, preferably ahead of the cooling structure, comprises a distribution chamber, wherein the distribution chamber is disposed and configured for distributing onto the cooling structure a cooling fluid which flows along the first fluid path. To this end, the distribution chamber, in the direction from the first cavity towards the further cavity, preferably fluidically connects the first cavity to a multiplicity of entrances of the cooling structure. If the cooling structure comprises the multiplicity of cooling ribs, the distribution chamber thus preferably fluidically connects the first cavity to the ducts which are routed between two respective neighboring cooling ribs of the multiplicity of cooling ribs.

In an embodiment 14 according to the invention, the first light source is designed according to one of the embodiments 3 to 13 thereof, wherein the first fluid path, in the direction from the first cavity toward the further cavity, after at least part of the cooling structure, preferably after the cooling structure, and ahead of the further cavity comprises a collection chamber, wherein the collection chamber is disposed and configured for directing into the further cavity a cooling fluid which has flowed along the first fluid path through at least part of the cooling structure. To this end, the collection chamber, in the direction from the first cavity toward the further cavity, preferably fluidically connects a multiplicity of exits of the cooling structure to the further cavity. If the cooling structure comprises the multiplicity of cooling ribs, the collection chamber preferably fluidically connects the ducts which are routed between two respective neighboring cooling ribs of the multiplicity of cooling ribs to the further cavity. The first fluid path, in the direction from the first cavity toward the second cavity, is preferably composed of the distribution chamber, the ducts which are routed between two respective neighboring cooling ribs of the multiplicity of cooling ribs, and the collection chamber. Additionally, ducts which are routed between outermost cooling ribs of the multiplicity of cooling ribs and a periphery of the first carrier element can also be part of the first fluid path.

In an embodiment 15 according to the invention, the first light source is designed according to one of the embodiments 3 to 14 thereof, wherein the cooling structure is at least in part situated in the first fluid path.

In an embodiment 16 according to the invention, the first light source is designed according to one of the preceding embodiments thereof, wherein the carrier surface and the cooling surface are mutually opposite external surfaces of the first carrier element.

In an embodiment 17 according to the invention, the first light source is designed according to one of the preceding embodiments thereof, wherein the first fluid path is at least in part additionally delimited by a surface of the distributor element that faces the first carrier element. Preferably, the first fluid path across the entire extent thereof between the first cavity and the further cavity is delimited, preferably formed, by the cooling surface and preferably additionally by that surface of the distribution element that faces the first carrier element.

In an embodiment 18 according to the invention, the first light source is designed according to one of the preceding embodiments thereof, wherein the first carrier element along the first fluid path has a minimum thickness in a range from 0.5 to 5 mm, preferably from 0.5 to 3 mm, more preferably from 0.5 to 2 mm, even more preferably from 0.5 to 1.5 mm, most preferably from 0.7 to 1.3 mm.

In an embodiment 19 according to the invention, the first light source is designed according to one of the preceding embodiments thereof, wherein each first light-emitting semiconductor component comprises a substrate and at least one semiconductor chip which superimposes the substrate on a side that faces away from the first carrier element. Preferably, each first light-emitting semiconductor component additionally comprises at least one optic which superimposes the at least one semiconductor chip on a side that faces away from the substrate. In the case of an LED as the light-emitting semiconductor component, the preceding construction comprising the substrate and the semiconductor chip and, optionally, one or a plurality of optics, in the technical field is also referred to as a package. Package and LED are often used synonymously. In the case of the chip-on-board technology, which is likewise considered in the context of the invention, a plurality of semiconductor chips are disposed on a common substrate. In this case, the package thus comprises a plurality of semiconductor chips. In general, a package can comprise further elements such as electrical contacts, protective circuits and elements for discharging heat.

In an embodiment 20 according to the invention, the first light source is designed according to one of the preceding embodiments thereof, wherein the at least one first light-emitting semiconductor component is at least one first light-emitting diode. A preferred first light-emitting diode is one of the packages described above.

In an embodiment 21 according to the invention, the first light source is designed according to one of the preceding embodiments thereof, wherein the first cavity is disposed and configured as an inflow for a cooling medium, wherein the further cavity is disposed and configured as a return flow for the cooling medium.

In an embodiment 22 according to the invention, the first light source is designed according to one of the preceding embodiments thereof, wherein the at least one first light-emitting semiconductor component is connected to the carrier surface. The at least one first light-emitting semiconductor component is preferably selected from the group consisting of adhesively bonded to the carrier surface, soldered to the carrier surface, and sintered to the carrier surface, or a combination of at least two of the aforementioned. The substrate of the at least one first light-emitting semiconductor component is preferably connected to the carrier surface, preferably in one of the ways mentioned above.

In an embodiment 23 according to the invention, the first light source is designed according to one of the preceding embodiments thereof, wherein the first light source comprises at least one further carrier element, wherein each further carrier element
  a. is superimposed on the distributor element;
  b. has a further carrier surface;
  c. additionally has a further cooling surface; and
  d. on the carrier surface thereof is superimposed by at least one further light-emitting semiconductor component;
wherein for each further carrier element the first cavity and the further cavity are in each case fluidically connected to one another by a further fluid path, wherein the respective further fluid path is at least in part delimited by the further cooling surface of the respective further carrier element.

In an embodiment 24 according to the invention, the first light source is designed according to the embodiment 23 thereof, wherein the light source comprises 5 to 150, preferably 10 to 150, more preferably 15 to 120, even more preferably from 15 to 100, most preferably 15 to 75 further carrier elements. The sum of the first carrier element and further carrier elements of the first light source is preferably an integral multiple of two. This facilitates in particular an actuation of cooling the first light source.

In an embodiment 25 according to the invention, the first light source is designed according to the embodiment 23 or 24 thereof, wherein each further carrier element is releasably connected to the distributor element, preferably in each case by at least one fastener.

In an embodiment 26 according to the invention, the first light source is designed according to one of the preceding embodiments thereof, wherein the first carrier element has a width in a range from 5 to 100 mm, preferably from 10 to 50 mm, more preferably from 15 to 40 mm, even more preferably from 20 to 35 mm, most preferably from 20 to 30 mm. Each further carrier element also preferably has the preceding width in a range from 5 to 100 mm, preferably from 10 to 50 mm, more preferably from 15 to 40 mm, even more preferably from 20 to 35 mm, most preferably from 20 to 30 mm. The carrier elements often have a width of approximately 1 inch, thus approximately 25.4 mm. The width of a carrier element is more than the thickness thereof and less than the length thereof. The width of a carrier element in the light source preferably runs in the longitudinal direction.

In an embodiment 27 according to the invention, the first light source is designed according to one of the embodiments 23 to 26 thereof, wherein the at least one further light-emitting semiconductor component is at least one further light-emitting diode.

In an embodiment 28 according to the invention, the first light source is designed according to one of the preceding embodiments thereof, wherein the distributor element is elongate in a longitudinal direction. The distributor element in the longitudinal direction preferably has a length in a range from 100 to 3,000 mm, more preferably from 200 to 3,000 mm, yet more preferably from 300 to 3,000 mm, even more preferably from 400 to 3,000 mm, most preferably from 400 to 2,000 mm.

In an embodiment 29 according to the invention, the first light source is designed according to the embodiment 28 thereof, wherein the first carrier element and the at least one further carrier element are successively disposed in the longitudinal direction.

In an embodiment 30 according to the invention, the first light source is designed according to the embodiment 28 or 29 thereof, wherein the first cavity
  a] comprises a first duct which is elongate in the longitudinal direction; and
  b] additionally a second duct which is elongate in a direction from the first duct towards the first carrier element;
wherein the first duct and the second duct of the first cavity are fluidically connected to one another, wherein a diameter of the first duct of the first cavity is larger than a diameter of the second duct of the first cavity. The first cavity preferably comprises two second ducts which are in each case elongate in a direction from the first duct towards the first carrier element. The two ducts of the first cavity preferably run in the same direction, preferably so as to be mutually parallel. Each second duct of the first cavity preferably has a diameter in a range from 0.5 to 5 mm, more preferably from 0.7 to 3 mm, yet more preferably from 0.8 to 2 mm, even more preferably from 1 to 1.8 mm, most preferably from 1.1 to 1.5 mm.

In an embodiment 31 according to the invention, the first light source is designed according to the embodiment 30 thereof, wherein no cross-sectional area of the first duct of the first cavity is smaller than a sum of the cross-sectional areas of each second duct of the first cavity.

The first light source in an embodiment 32 according to the invention is designed according to one of the embodiments 28 to 31 thereof, wherein the further cavity
  a} comprises a first duct which is elongate in the longitudinal direction; and
  b} additionally a second duct which is elongate in a direction from the first duct towards the first carrier element;
wherein the first duct and the second duct of the further cavity are fluidically connected to one another, wherein a diameter of the first duct of the further cavity is larger than a diameter of the second duct of the further cavity. The further cavity preferably comprises two second ducts which are in each case elongate in a direction from the first duct towards the first carrier element. The second ducts of the further cavity preferably run in the same direction, preferably so as to be mutually parallel. Furthermore preferably, the second ducts of the first and of the further cavity run in the same direction, preferably so as to be mutually parallel. Each second duct of the further cavity preferably has a diameter in a range from 0.5 to 5 mm, more preferably from 0.7 to 3 mm, yet more preferably from 0.8 to 2 mm, even more preferably from 1 to 1.8 mm, most preferably from 1.1 to 1.5 mm.

In an embodiment 33 according to the invention, the first light source is designed according to the embodiment 32 thereof, wherein no cross-sectional area of the first duct of the further cavity is smaller than a sum of the cross-sectional areas of each second duct of the further cavity.

In an embodiment 34 according to the invention, the first light source is designed according to one of the embodiments 28 to 33 thereof, wherein the distributor element in the longitudinal direction is delimited by a first end face and a further end face which is opposite the first end face, wherein the first cavity or the further cavity, or both, from the first end face is/are in each case elongate up to the further end face.

In an embodiment 35 according to the invention, the first light source is designed according to one of the embodiments 30 to 34 thereof, wherein the first cavity for each further carrier element additionally comprises in each case at least one third duct which is elongate in a direction from the first duct of the first cavity towards the respective further carrier element, wherein the first duct and each third duct of the first cavity are fluidically connected to one another, wherein the diameter of the first duct of the first cavity is larger than a diameter of each third duct of the first cavity. Preferably, the first cavity for each further carrier element additionally comprises two third ducts which are in each case elongate in a direction from the first duct of the first cavity towards the respective further carrier element. The third ducts of the first cavity preferably run in the same direction, preferably so as to be mutually parallel.

In an embodiment 36 according to the invention, the first light source is designed according to one of the embodiments 32 to 35 thereof, wherein the further cavity for each further carrier element additionally comprises in each case at least one third duct which is elongate in a direction from the first duct of the further cavity towards the respective further carrier element, wherein the first duct and each third duct of the further cavity are fluidically connected to one another, wherein the diameter of the first duct of the further cavity is larger than a diameter of each third duct of the further cavity. Preferably, the further cavity for each further carrier element additionally comprises two third ducts which are in each case elongate in a direction from the first duct of the further cavity towards the respective further carrier element. The third ducts of the further cavity preferably run in the same direction, preferably so as to be mutually parallel. Furthermore preferably, the third ducts of the first and of the further cavity run in the same direction, preferably so as to be mutually parallel.

In an embodiment 37 according to the invention, the first light source is designed according to one of the preceding embodiments thereof, wherein the distributor element has a one-piece design. An element has a one-piece design when the element has been made in one piece, preferably from a shapeless material, without different component parts being subsequently joined. Accordingly, the distributor element preferably does not comprise any joint such as, for example, a seam, a welded joint, a soldered joint, or an adhesively bonded joint. The distributor element is preferably obtainable in a one-piece design by extrusion and optionally downstream subtractive machining steps such as, for example, drilling.

In an embodiment 38 according to the invention, the first light source is designed according to one of the preceding embodiments thereof, wherein the distributor element is configured as a housing of the light source. A housing is a component of the light source that accommodates the remaining components of the light source and substantially forms an external surface of the light source which protects the inner components in relation to environmental influences such as dust and mechanical influences, "substantially" meaning with the exception of any potential windows, openings and connectors.

In an embodiment 39 according to the invention, the first light source is designed according to one of the preceding embodiments thereof, wherein the distributor element does not have any inner cooling structure. In particular, the distributor element in the interior thereof does not have any macroscopic or microscopic ducts which serve for enlarging an inner surface of the distributor element for discharging heat to a cooling fluid. The first cavity and the further cavity do not serve for the aforementioned enlargement of the surface but as an oriented inflow and return flow for a cooling fluid. This can be seen in particular by the absence of multiple branches of ducts which for an inflow or return flow represent unproductive diversions. Alternatively or additionally, the distributor element preferably does not have a cooling structure on any external surface.

In an embodiment 40 according to the invention, the first light source is designed according to one of the preceding embodiments thereof, wherein the distributor element comprises an electrically conductive material, preferably is composed of the electrically conductive material. A preferred electrically conductive material is a metal. A preferred metal is one selected from the group consisting of aluminum, copper, gold, nickel and steel, or a combination of at least two of the aforementioned. The distributor element is preferably composed of aluminum.

In an embodiment 41 according to the invention, the first light source is designed according to one of the preceding embodiments thereof, wherein the first carrier element comprises an electrically conductive material, preferably is composed of the electrically conductive material.

In an embodiment 42 according to the invention, the first light source is designed according to one of the preceding embodiments thereof, wherein the first carrier element in the direction from the carrier surface toward the cooling surface as mutually superimposed layers comprises a layer sequence of I) a first coating; and
II) a main body;

wherein the first coating at least partially, preferably completely, forms the carrier surface.

In an embodiment 43 according to the invention, the first light source is designed according to the embodiment 42 thereof, wherein the first coating comprises gold, preferably is composed of gold.

In an embodiment 44 according to the invention, the first light source is designed according to the embodiment 42 or 43 thereof, wherein the first coating has a thickness in a range from 0.01 to 1 µm, more preferably from 0.01 to 0.5 µm, even more preferably from 0.01 to 0.3 µm, most preferably from 0.02 to 0.2 µm.

In an embodiment 45 according to the invention, the first light source is designed according to one of the embodiments 42 to 44 thereof, wherein the main body comprises a material selected from the group consisting of aluminum, copper, and steel, or a combination of at least two of the aforementioned, preferably is composed thereof, wherein copper is particularly preferable.

In an embodiment 46 according to the invention, the first light source is designed according to one of the embodiments 42 to 45 thereof, wherein the first carrier element between the first coating and the main body comprises a second coating.

In an embodiment 47 according to the invention, the first light source is designed according to the embodiment 46 thereof, wherein the second coating comprises nickel, preferably is composed of nickel.

In an embodiment 48 according to the invention, the first light source is designed according to the embodiment 46 or 47 thereof, wherein the further coating has a thickness in a range from 1 to 50 µm, more preferably from 1 to 40 µm, yet more preferably from 1 to 30 µm, still more preferably from 1 to 20 µm, further more preferably from 1 to 10 µm, even more preferably from 2 to 8 µm, most preferably from 3 to 7 µm.

In an embodiment 49 according to the invention, the first light source is designed according to one of the embodiments 46 to 48 thereof, wherein the first carrier element between the first coating and the second coating comprises a third coating.

In an embodiment 50 according to the invention, the first light source is designed according to the embodiment 49 thereof, wherein the third coating comprises palladium, preferably is composed of palladium.

In an embodiment 51 according to the invention, the first light source is designed according to one of the preceding embodiments thereof, wherein the distributor element furthermore comprises a mounting which is disposed and configured for holding an emission window. The distributor element is preferably also configured as the housing of the light source.

In an embodiment 52 according to the invention, the first light source is designed according to the embodiment 51 thereof, wherein the emission window is superimposed on the at least one first light-emitting semiconductor component on a side of the at least one first light-emitting semiconductor component that faces away from the carrier element.

In an embodiment 53 according to the invention, the first light source is designed according to the embodiment 51 or 52 thereof, wherein the light source comprises the emission window.

In an embodiment 54 according to the invention, the first light source is designed according to one of the preceding embodiments thereof, wherein the light source additionally comprises a first sealing element, wherein the first sealing element is disposed and configured for fluid-tightly sealing the first fluid path. The first sealing element is at least in part preferably disposed between the first carrier element and the distributor element. More preferably, the first sealing element is in contact with the first carrier element and the distributor element. Even more preferably, the first sealing element connects the first carrier element and the distributor element in a fluid-tight manner. The first sealing element is preferably accommodated in a groove in the distributor element. A preferred first sealing element is configured as an O-ring, wherein this O-ring preferably has a rectangular shape instead of a circular shape.

In an embodiment 55 according to the invention, the first light source is designed according to one of the preceding embodiments thereof, wherein the at least one first light-emitting semiconductor component is disposed and configured for emitting light in a UV wavelength range or in an IR wavelength range, or both. A preferred UV wavelength range is selected from the group consisting of a UV-A wavelength range, a UV-B wavelength range, and a UV-C wavelength range, or a combination of at least two of the aforementioned.

In an embodiment 56 according to the invention, the first light source is designed according to one of the preceding embodiments thereof, wherein the light source comprises an LED module, preferably is an LED module.

In an embodiment 57 according to the invention, the first light source is designed according to one of the preceding embodiments thereof, wherein the light source comprises a ballast. A preferred ballast is an electronic ballast. A preferred electronic ballast is an LED driver.

A contribution toward achieving at least one of the objects according to the invention is made by an embodiment 1 of a first method for producing a light source, the first method comprising as method steps:

A} providing
   a) at least one first light-emitting semiconductor component,
   b) a first carrier element comprising
      i) a first carrier surface, and
      ii) additionally a first cooling surface, and
   c) a distributor element comprising
      i) a first cavity, and
      ii) a further cavity, and B} releasably connecting the first carrier element to the distributor element, preferably using at least one fastener, such that the first cavity and the further cavity are fluidically connected to one another by a first fluid path;

wherein the at least one first light-emitting semiconductor component is superimposed on the first carrier element on a side of the first carrier surface; wherein the first fluid path is at least in part delimited by the first cooling surface. The releasable connecting in the first method step B} preferably comprises, more preferably is, screw-fitting. Furthermore preferably in the first method step B}, a first sealing element is at least in part disposed between the first carrier element and the distributor element. Components and elements used in the context of the first method are in each case preferably designed as identical or equivalent components or elements of the first light source according to the invention according to one of the embodiments thereof. The first method is preferably a method for producing the first light source according to the invention according to one of the embodiments of the first light source.

In an embodiment 2 according to the invention, the first method is designed according to the embodiment 1 thereof, wherein the first cooling surface is at least in part a surface of a cooling structure of the first carrier element, wherein in the first method step A} the providing of the first carrier element comprises generating the cooling structure using a disk cutter. The generating preferably comprises cutting cooling ribs using the disk cutter. The disk cutter preferably comprises a multiplicity of disk-shaped cutting blades. The disk cutter preferably comprises 4 to 31, more preferably 6 to 26, most preferably 11 to 21 disk-shaped cutting blades. The disk cutter particularly preferably comprises one disk-shaped cutting blade for each duct which is routed between two respective neighboring cooling ribs of a multiplicity of cooling ribs of the cooling structure and, more preferably, also two further disk-shaped cutting blades.

In an embodiment 3 according to the invention, the first method is designed according to the embodiment 1 or 2 thereof, wherein in the first method step A} furthermore at least one further light-emitting semiconductor component and at least one further carrier element are provided, wherein each further carrier element
   a. has a further carrier surface;
   b. additionally has a further cooling surface; and c. on the further carrier surface thereof is superimposed at least one further light-emitting semiconductor component;

wherein the first method furthermore a method step

C} releasably connecting the at least one further carrier element, preferably in each case using at least one fastener, to the distributor element such that the first cavity and the further cavity of each further carrier element are fluidically connected to one another by a further fluid path;

wherein the respective further fluid path is at least in part delimited by the further cooling surface of the respective further carrier element.

A contribution toward achieving at least one of the objects according to the invention is made by an embodiment 1 of a second light source, obtainable by the first method according to one of the embodiments thereof. The second light source is preferably configured like the first light source according to one of the embodiments thereof, particularly preferably according to the embodiment 11 or 12.

A contribution toward achieving at least one of the objects according to the invention is made by an embodiment 1 of a printing machine, comprising the first or second light source, in each case according to one of the preceding embodiments of the first or second light source. Any type of printing machine which is suitable for using the first or second light source according to the invention is considered as a printing machine according to the invention. A preferred printing machine is configured for carrying out the first method according to the invention according to one of the embodiments thereof.

In an embodiment 2 according to the invention, the printing machine is designed according to the embodiment 1 thereof, wherein the light source in the printing machine is disposed and configured for irradiating a composition printed on a print medium.

In an embodiment 3 according to the invention, the printing machine is designed according to the embodiment 2 thereof, wherein the composition is a printing ink or a varnish, or both.

In an embodiment 4 according to the invention, the printing machine is designed according to one of the embodiments 1 to 3 thereof, wherein the printing machine is a printing machine without a print image memory. A preferred printing machine without a print image memory is configured for non-impact printing (NIP). A preferred printing machine without a print image memory is an inkjet printer or a laser printer, or both.

In an embodiment 5 according to the invention, the printing machine is designed according to one of the embodiments 1 to 3 thereof, wherein the printing machine comprises a print image memory. A preferred print image memory is a printing roller or a printing plate.

In an embodiment 6 according to the invention, the printing machine is designed according to the embodiment 5 thereof, wherein the printing machine is disposed and configured for indirect printing by the print image memory. A preferred printing machine for indirect printing is an offset printing machine. A preferred offset printing machine is a sheet-fed offset printing machine.

A contribution toward achieving at least one of the objects according to the invention is made by an embodiment 1 of a second method comprising as method steps:

A) providing
   I) the first or second light source, in each case according to one of the embodiments thereof; and
   II) an object;
B) superimposing on the object a composition; and
C) irradiating the composition with light emitted by the at least one first light-emitting semiconductor component.

In an embodiment 2 according to the invention, the second method is designed according to the embodiment 1 thereof, wherein the composition in the second method step B), preferably also in the second method step C), is liquid.

In an embodiment 3 according to the invention, the second method is designed according to the embodiment 1 or 2 thereof, wherein the composition in the second method step B) comprises at least one colorant, preferably at a proportion in a range from 0.5 to 20% by weight, more preferably from 1 to 15% by weight, even more preferably from 2 to 10% by weight, most preferably from 3 to 8% by weight, in each case in terms of the composition in the second method step B).

In an embodiment 4 according to the invention, the second method is designed according to one of the embodiments 1 to 3 thereof, wherein the composition in the second method step B) comprises a vehicle, preferably at a proportion in a range from 10 to 95% by weight, more preferably from 20 to 95% by weight, even more preferably from 30 to 95% by weight, most preferably from 40 to 90% by weight, in each case based on the composition in the second method step B).

In an embodiment 5 according to the invention, the second method is designed according to one of the embodiments 1 to 4 thereof, wherein the composition in the second method step B) comprises a photoinitiator, preferably at a proportion in a range from 1 to 30% by weight, more preferably from 2 to 25% by weight, even more preferably from 3 to 20% by weight, most preferably from 5 to 15% by weight, in each case based on the composition in the second method step B).

In an embodiment 6 according to the invention, the second method is designed according to one of the embodiments 1 to 5 thereof, wherein the composition in the second method step B) comprises at least one monomer, preferably at a proportion in a range from 10 to 95% by weight, more preferably from 20 to 95% by weight, yet more preferably from 30 to 90% by weight, still more preferably from 40 to 85% by weight, even more preferably from 50 to 85% by weight, most preferably from 60 to 80% by weight, in each case based on the composition in the second method step B).

In an embodiment 7 according to the invention, the second method is designed according to one of the embodiments 1 to 6 thereof, wherein the composition in the second method step B) comprises at least one oligomer, preferably at a proportion in a range from 1 to 50% by weight, preferably from 1 to 40% by weight, more preferably from 2 to 30% by weight, even more preferably from 3 to 25% by weight, most preferably from 5 to 20% by weight, in each case based on the composition in the second method step B).

In an embodiment 8 according to the invention, the second method is designed according to one of the embodiments 1 to 7 thereof, wherein the second method step C) comprises curing of the composition.

In an embodiment 9 according to the invention, the second method is designed according to the embodiment 8 thereof, wherein the curing comprises a reduction of one proportion of a vehicle in the composition.

In an embodiment 10 according to the invention, the second method is designed according to the embodiment 8 or 9 thereof, wherein the curing comprises polymerizing a monomer or an oligomer, or both, in the composition.

In an embodiment 11 according to the invention, the second method is designed according to one of the embodiments 1 to 10 thereof, wherein the composition is a printing ink or a varnish, or both.

In an embodiment 12 according to the invention, the second method is designed according to one of the embodiments 1 to 11 thereof, wherein the second method is a method for producing a printed product.

In an embodiment 13 according to the invention, the second method is designed according to one of the embodiments 1 to 12 thereof, wherein in the second method step A) the printing machine according to the invention is provided according one of the embodiments thereof.

In an embodiment 14 according to the invention, the second method is designed according to one of the embodiments 1 to 13 thereof, wherein the superimposing in the second method step B) is printing the object with the composition. A preferred object is a print medium, also referred to as a printing stock.

In an embodiment 15 according to the invention, the second method is designed according to one of the embodiments 1 to 14 thereof, wherein in the second method step C) a cooling fluid flows through the first fluid path.

In an embodiment 16 according to the invention, the second method is designed according to the embodiment 15 thereof, wherein in the second method step C) the cooling fluid flows through the first fluid path at a pressure in a range from more than 1 up to 20 bar, preferably from more than 1 to 15 bar, more preferably from more than 1 to 10 bar, yet more preferably from more than 1 to 8 bar, even more preferably from 2 to 6 bar, most preferably from 3 to 5 bar.

In an embodiment 17 according to the invention, the second method is designed according to one of the embodiments 1 to 16 thereof, wherein in the second method step C) the first carrier element is cooled at a cooling output in a range from 100 to 1,000 W, preferably 100 to 500 W, more preferably from 200 to 400 W. If the light source comprises at least one further carrier element, each further carrier element is preferably cooled at a cooling output in one of the preceding ranges.

In an embodiment 18 according to the invention, the second method is designed according to one of the embodiments 1 to 17 thereof, wherein the light source is the first light source according to one of the embodiments 21 to 50 thereof, wherein in the second method step C) a maximum temperature of the carrier surface of the first carrier element deviates from a maximum temperature of the carrier surface of each further carrier element by no more than 10 K, preferably not more than 8 K, more preferably not more than 6 K, most preferably not more than 5 K.

A contribution toward achieving at least one of the objects according to the invention is made by an embodiment 1 of a printed product, obtainable by the second method according to one of the embodiments 1 to 18 thereof.

In an embodiment 2 according to the invention, the printed product is designed according to the embodiment 1 thereof, wherein the printed product is one selected from the group consisting of a magazine, a book, a poster, an advertisement, and a label, or a combination of at least two of the aforementioned.

A contribution toward achieving at least one of the objects according to the invention is made by an embodiment 1 of an assembly comprising
A. the first or second light source, in each case according to one of the embodiments thereof; and
B. a material to be irradiated;
wherein the light source and the material to be irradiated are disposed and configured for irradiating the material to be irradiated with light emitted from the at least one first light-emitting semiconductor component.

In an embodiment 2 according to the invention, the assembly is designed according to the embodiment 1 thereof, wherein the material to be irradiated comprises an object and a composition superimposed on the object, wherein the light source and the material to be irradiated are disposed and configured for irradiating the composition with the light emitted by the at least one first light-emitting semiconductor component. A preferred object is a print medium. The composition is preferably designed according to an embodiment of the second method according to the invention.

A contribution toward achieving at least one of the objects according to the invention is made by an embodiment 1 of a third method, comprising as method steps:
A] providing the assembly according to the invention according to one of the embodiments thereof; and
B] irradiating the material to be irradiated with light emitted by the at least one first-light-emitting semiconductor component.

In a preferred embodiment, the third method is a method for irradiating the material to be irradiated.

In an embodiment 2 according to the invention, the third method is designed according to the embodiment 1 thereof, wherein the third method step B] comprises curing a composition. The third method is preferably a method for curing the composition.

In an embodiment 3 according to the invention, the third method is designed according to the embodiment 2 thereof, wherein the curing comprises a reduction of a proportion of a vehicle in the composition.

In an embodiment 4 according to the invention, the third method is designed according to the embodiment 2 or 3 thereof, wherein the curing comprises polymerizing a monomer or an oligomer, or both, in the composition.

A contribution toward achieving at least one of the objects according to the invention is made by an embodiment 1 of a first use of the first or second light source, in each case according to one of the embodiments thereof, for curing a composition. The composition is preferably designed according to an embodiment of the second method according to the invention. The curing furthermore preferably takes place according to an embodiment of the second method according to the invention.

A contribution toward achieving at least one of the objects according to the invention is made by an embodiment 1 of a second use of the first or second light source, in each case according to one of the embodiments thereof, in a printing machine. A preferred printing machine is designed like the printing machine according to the invention according to one of the embodiments thereof. The light source in the printing machine is furthermore preferably used for curing a composition. The curing preferably takes place according to an embodiment of the second method according to the invention.

Features which are described as being preferable in one category according to the invention, for example according to the first light source or the first method according to the invention, are likewise preferable in an embodiment of the further categories according to the invention, for example an embodiment of the assembly according to the invention or the first or second use.

Light Source

In the context of the invention, any device configured for emitting electromagnetic radiation which to the person skilled in the art appears suitable for the use according to the invention, preferably for use in a printing machine, can be considered as a light source. The term "electromagnetic radiation," apart from visible light, also comprises component parts of the electromagnetic spectrum that are not visible to the human eye. Preferred electromagnetic radiation is in the wavelength range from 10 nm to 1 mm. Furthermore preferred electromagnetic radiation is infrared radiation (IR radiation) or ultraviolet radiation (UV radiation), or a mixture of both. According to standard DIN 5031-7, the wavelength range of UV radiation is from 10 to 380 nm. According to the definition, UV-A radiation is in the range from 315 to 380 nm, UV-B radiation in the range from 280 to 315 nm, UV-C radiation in the range from 100 to 280 nm, and EUV radiation in the range from 10 to 121 nm. In the context of the invention, UV radiation is selected from the group consisting of UV-A radiation, UV-B radiation, and UV-C radiation, or particularly preferably a combination of at least two of the aforementioned. It is to be taken into account that the previously mentioned standard defines the wavelength ranges of UV radiation but in the technical field of LEDs, which as described below are preferred light-emitting semiconductor components in the context of the invention, LEDs with maxima of the emitted intensity (also referred to as peak wavelength in the technical field) at wavelengths which are not within the wavelength ranges stated in the standard, are also referred to as UV-LEDs. For example, LEDs with maxima of emitted intensity at wavelengths of 385 nm, 395 nm and 405 nm are also referred to as UV-A-LEDs. In the context of the invention, such LEDs are also part of the preferred light-emitting semiconductor components. Furthermore, the mode of reference of the technical field is adopted here, and such LEDs are also referred to as UV-LEDs. A preferred light source comprises an LED module, or is an LED module. An LED module preferably comprises a circuit board on which a plurality of LEDs are disposed. The LEDs can in each case be equipped with optics. Furthermore, one piece of optics can also be assigned to a plurality of LEDs. A piece of optics is an element which is disposed and configured for manipulating electromagnetic radiation. Optical components as well as optical component parts are both considered here. A preferred piece of optics is one selected from the group consisting of transmission optics, conversion optics, and reflection optics, or a combination of at least two of the aforementioned. A piece of transmission optics is optics which for manipulating the electromagnetic radiation are penetrated by the electromagnetic radiation. A preferred piece of transmission optics is a lens or a transmission grating. A piece of conversion optics is an optics which is disposed and configured for modifying a wavelength of electromagnetic radiation. In the case of an LED, the conversion optics can preferably serve for adapting a color of the light emitted by the LED. A preferred piece of conversion optics is a conversion layer, thus a layer comprising at least one fluorescent colorant. A piece of reflection optics is an optics which for manipulating the electromagnetic radiation, in particular in a direction of propagation of the electromagnetic radiation, reflects the electromagnetic radiation. A preferred piece of reflection optics is a mirror or a reflection grating. The light source furthermore preferably comprises a ballast which is disposed and configured for operating the LED module. A preferred ballast is an LED driver.

Light-Emitting Semiconductor Component

Any constructional element containing a semiconductor which to the person skilled in the art appears suitable as a light-emitting component of the light source according to the invention can be considered as a light-emitting semiconductor component. Light-emitting diodes (LEDs) and laser diodes (also referred to as semiconductor lasers) are particular light-emitting semiconductor components, wherein light-emitting diodes are particularly preferable. A particularly preferable LED is an IR-LED or a UV-LED, or both. A preferred UV-LED is one selected from the group consisting of a UV-A LED, a UV-B LED, and a UV-C LED, or a combination of at least two of the aforementioned.

Carrier Element

Any constructional element which appears suitable to the person skilled in the art for use in a light source according to the invention can be considered as a carrier element. A preferred carrier element is configured so as to be plate-shaped, thus as a carrier plate. A particularly preferable carrier element is a cooling plate. Referred to as a plate here is an element of planar configuration, the thickness thereof at any point being smaller than the respective length and width thereof by at least a factor of two, more preferably at least five. The carrier element is preferably composed to an extent of at least 80% by weight, more preferably at least 90% by weight, even more preferably at least 95% by weight of a material with a thermal conductivity of at least 50 W/(m·K), more preferably at least 100 W/(m·K), even more preferably at least 200 W/(m·K), most preferably at least 230 W/(m·K). The carrier element preferably comprises a metal at a proportion of at least 80% by weight, more preferably at least 90% by weight, even more preferably at least 95% by weight. A preferred metal is copper or aluminum, or an alloy comprising one or both of the aforementioned metals. In one preferred design embodiment, the aforementioned material forms a main body of the carrier element, the main body moreover potentially having one or a plurality of coatings. A preferred coating is composed of one selected from the group consisting of nickel, palladium, and gold, or from an alloy comprising at least one of the aforementioned metals. If the carrier element comprises a plurality of coatings, the coatings are superimposed on the main body from the main body outward, preferably in the aforementioned sequence. Here, the layer sequences of main body, nickel coating, gold coating, or else main body, nickel coating, palladium coating, gold coating, are particularly preferred. The carrier element particular preferably has the aforementioned coatings at least on the side of the carrier surface thereof. The elements which are referred to as the carrier element are preferably not a substrate or a circuit board of an LED or of an LED module. Rather, the carrier element is preferably a constructional element, on the carrier surface of which a multiplicity of LEDs or an LED module can be disposed. The carrier surface of a carrier element is preferably embodied to be substantially planar.

Cooling Structure

Any structure which to the person skilled in the art appears suitable for increasing a heat discharge of the carrier element from the cooling surface of the carrier element to an environment, in particular to a cooling fluid, can be considered as a cooling structure. A preferred cooling structure comprises one selected from the group consisting of lamellae, cooling ribs, pores and ducts, or a combination of at least two of the aforementioned. Cooling ribs are particularly preferred. Cooling ribs are also referred to as cooling fins. Cooling ribs are planar elements. These planar elements on one edge are preferably in each case connected to a carrier element of which the respective cooling structure is a part. An opposite edge of the planar element in the light source according to the invention is preferably in contact with the distributor element. The planar elements are preferably disposed so as to be mutually plane-parallel. Furthermore, the planar elements preferably have rectangular lateral faces.

Distributor Element

In principle, any constructional element which to the person skilled in the art appears suitable for use according to the invention can be considered as a distributor element. The distributor element preferably serves as a distributor for a cooling fluid and as a constructional element which supports the first carrier element and the potential further carrier elements of the light source according to the invention. To this end, the distributor element preferably has electrical connectors as well as connectors for an inflow and a return flow of a cooling fluid. The aforementioned connectors are preferably situated on one or both end sides of the distributor element. The distributor element furthermore preferably comprises an inflow and a return flow for a cooling fluid.

Superimposing

When it is defined that an element, for example a layer or a constructional element, superimposes or is superimposed on another element, these elements can thus be directly successive, that is to say without any intervening further element, or indirectly successive, that is to say having at least one intervening further element. Directly successive elements preferably are mutually contiguous, that is to say that they are in mutual contact. Elements which superimpose one another are furthermore preferably connected to one another. Elements which superimpose one another can be indirectly or directly connected to one another. Two elements are connected to one another when their mutual cohesion exceeds Van der Waals attraction forces. Elements which are connected to one another are preferably selected from the group consisting of soldered, welded, sintered, screw-fitted, and adhesively bonded to one another, or a combination of at least two of the aforementioned. A wording in which a sequence of layers comprises enumerated layers or coatings, means that at least the specified layers or coatings are present in the specified sequence. This wording does not mandatorily mean that these layers or coatings are directly successive. A wording in which two layers are mutually contiguous means that these two layers are directly successive and thus without any intervening layer. If one layer superimposes another layer in a layer sequence, the one layer does not mandatorily superimpose the other layer across the entire area of the one or the other layer but preferably across a planar region of the two layers. The layers of the planar composite that form the layer sequence are preferably connected to one another in a planar manner.

Fluid Path

If two cavities or regions of one or a plurality of cavities are fluidically connected to one another, the cavities or regions can thus be directly fluidically connected to one another, thus be mutually contiguous, or be indirectly fluidically connected to one another, thus having an intervening cavity or a region of a cavity. In any case, the aforementioned regions or cavities are connected to one another such that a fluid can flow from the one region or cavity into the other. A preferred fluid is a cooling fluid.

Cooling Fluid

Any fluid which to the person skilled in the art appears suitable in the context of the invention, in particular for cooling the light source according to the invention, can be considered as a cooling fluid. A fluid is a medium capable of flowing. This includes in particular gases and liquids. A cooling liquid is preferred as a cooling fluid. A preferred cooling liquid comprises water or glycol, or a mixture of both. The cooling liquid is preferably composed of water or a water/glycol mixture.

Curing

The curing of a composition is a solidification of the composition, wherein from the composition a layer is obtained which by the curing is preferably also connected to the underlying object. The layer can be a contiguous layer, this being preferred in the case of the composition being a varnish, or a non-contiguous layer, for example in the form of letters formed by a printing ink. A preferred curing procedure is physical curing or chemical curing, or both. A preferred physical curing procedure is drying. Drying preferably comprises a reduction of a proportion of a vehicle in the composition, preferably to 0% by weight, preferably by evaporating the vehicle. A preferred vehicle is an organic vehicle or an inorganic vehicle. Water is preferable as an inorganic vehicle. A further preferred vehicle is a solvent. Chemical curing comprises a chemical reaction. A preferred chemical reaction is a polymerization reaction or a cross-linking reaction, or both. If the composition is a pulverulent composition, the curing comprises connecting particles of the pulverulent composition while maintaining a contiguous solid body which is preferably connected to the underlying object. In the case of a liquid composition, the liquid composition transitions from the liquid state to the solid state during curing.

Print Medium

Any object which to the person skilled in the art in the context of the invention appears suitable can be considered as a print medium, also referred to as a printing stock. A preferred print medium is of planar configuration. This means that a length and a width of the print medium are larger than a thickness of the print medium by a factor of at least 10, more preferably at least 100, even more preferably at least 1,000. A preferred planar print medium is configured in the shape of a web. This means that a length of the print medium is larger than a width of the print medium by a factor of at least 2, more preferably at least 5, even more preferably at least 10, most preferably at least 100. A preferred print medium comprises, preferably is composed of, paper, a film or a laminate. A preferred laminate comprises one or a plurality of polymer layers, one or a plurality of paper layers, one or a plurality of metal layers, or a combination of the aforementioned layers in a layer sequence.

Printing Ink

Printing inks are mixtures which contain a colorant and have a viscosity which is suitable for being applied as a thin layer. The thin layer in the cured state preferably has a thickness (dry thickness) in a range from 0.5 to 50 μm, preferably from 1 to 30 μm, more preferably from 1 to 20 μm. A preferred printing ink comprises one selected from the group consisting of one or a plurality of colorants, a binding agent, a vehicle, and an additive, or a combination of at least two, preferably all, of the aforementioned. A preferred binding agent is a resin or a polymer, or a mixture of both. A preferred vehicle is a solvent. A preferred additive serves for setting a desired property of the printing ink, preferably a desired processing property, for example a viscosity of the printing ink. A preferred additive is one selected from the group consisting of a dispersant additive, a defoamer, a wax, a lubricant, and a substrate wetting agent, or a combination of at least two of the aforementioned. Furthermore, a preferred printing ink is one selected from the group consisting of a toner, an ink for an inkjet printer, an offset printing ink, an illustration printing ink, a liquid ink, and a radiation-curing printing ink, or a combination of at least two of the aforementioned. A preferred offset printing ink is a rotary offset printing ink, or a sheet-fed offset printing ink, or both. A preferred rotary offset printing ink is a rotary offset cold-setting printing ink or a rotary offset heat-setting printing ink, or both. A preferred liquid ink is a water-based liquid ink or a solvent-based liquid ink, or both. A particularly preferred printing ink in a proportion of 8 to 15% by weight comprises at least one colorant, preferably at least one pigment, and in a total proportion of 25 to 40% by weight at least one resin or at least one polymer, or a mixture of the two, in a proportion of 30 to 45% by weight at least one high-boiling point petroleum (boiling range 250 to 210° C.), and in a total proportion of 2 to 8% by weight at least one additive, in each case based on the weight of the printing ink.

Varnish

A varnish is a liquid or else pulverulent coating material that has a viscosity which is suitable for application as a thin layer, and from which a solid, preferably contiguous, film is obtainable by curing. Varnishes often contain at least one selected from the group consisting of at least one binding agent, at least one filler material, at least one vehicle, at least one colorant, at least one resin and/or at least one acrylate, and at least one additive, or a combination of at least two of the aforementioned, wherein a combination of all aforementioned component parts (with resin and/or acrylate) is preferred. A preferred additive is a biocide. A preferred biocide is an in-can preservation agent. Varnishes often serve for protecting the object provided with the varnish, for decorating, for functionalizing a surface of the object, for example modifying electrical properties or resistance in relation to abrasion, or a combination of the aforementioned functions. A varnish which is preferred in the context of the invention is one selected from the group consisting of a water-based varnish, a solvent-based varnish, a UV-based and thus UV-curable varnish, and a dispersion varnish, or a combination of at least two of the aforementioned. A particularly preferred varnish is configured for protecting a printed surface.

Colorant

Both solid and liquid colorants which are known to the person skilled in the art and appear suitable for the present invention can be considered as colorants. According to DIN 55943:2001-10, "colorant" is a collective term for all color-imparting products, in particular for dyestuffs and pigments. A preferred colorant is a pigment. A preferred pigment is an organic pigment. Pigments which are notable in the context of the invention are in particular the pigments mentioned in DIN 55943:2001-10 and in "Industrial Organic Pigments, Third Edition" (Willy Herbst, Klaus Hunger Copyright @ 2004 WILEY-VCH Verlag GmbH & Co. KGaA, Weinheim ISBN: 3-527-30576-9). A pigment is a colorant which is preferably insoluble in the application medium. A dyestuff is a colorant which is preferably soluble in the application medium.

Method Steps

In the disclosed methods, the method steps take place in a step sequence in the specified sequence of the reference number of the method steps. The steps of a sequence of steps can be mutually successive indirectly or directly. Furthermore, mutually successive method steps in temporal terms can take place one after another, so as to temporally overlap, or else simultaneously.

Measuring Methods

Unless otherwise stated, the measurements which were carried out in the context of the invention were performed at an ambient temperature of 23° C., an ambient air pressure of 100 kPa (0.986 atm), and a relative air humidity of 50%.

BRIEF DESCRIPTION OF THE DRAWINGS

The invention will be illustrated in more detail by examples and drawings, wherein the examples and drawings do not limit the invention. Furthermore, unless otherwise stated, the drawings are not to scale.

Respectively in the drawings, included are the following figures.

DETAILED DESCRIPTION OF THE DISCLOSURE

Figure 1:
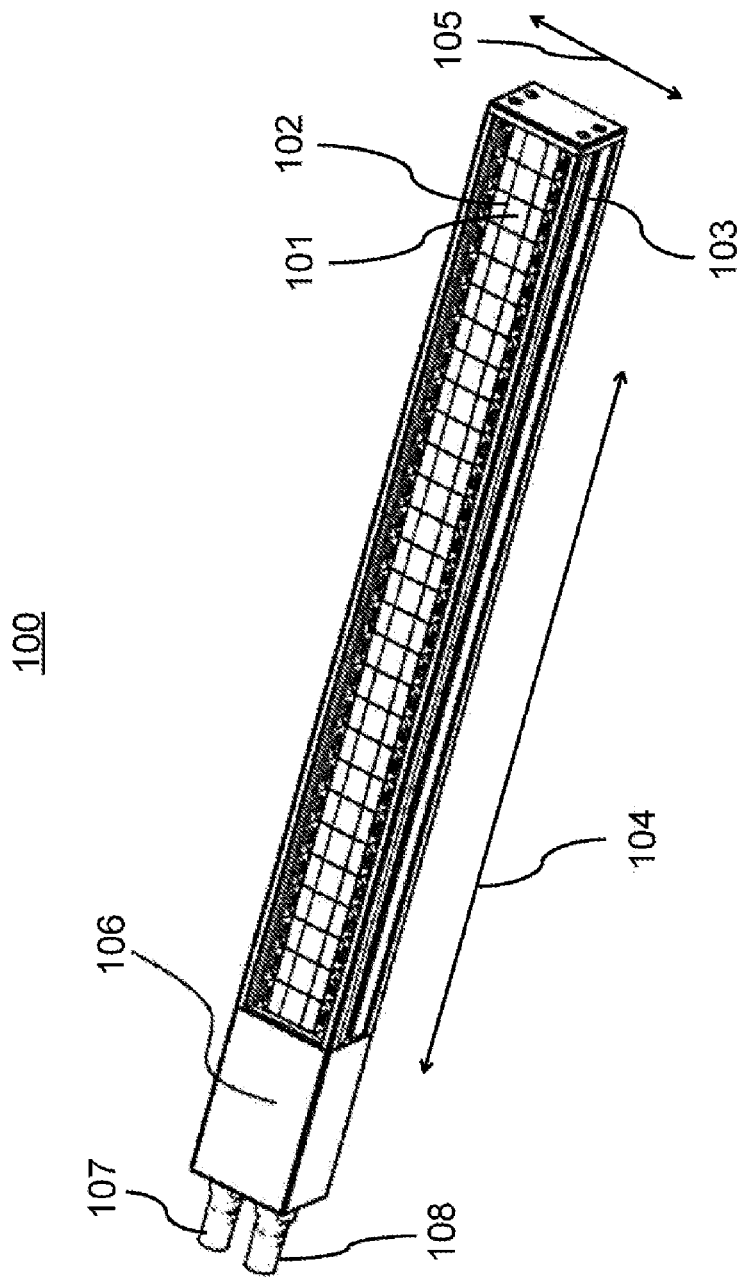
FIG. 1 shows a schematic illustration of a light source according to the invention.

FIG. 1 shows a schematic illustration of a light source 100 according to the invention. The light source 100 comprises a distributor element 103 of aluminum. The distributor element 103 is of a one-piece design and elongate in a longitudinal direction 104. A transverse direction 105 is perpendicular to the longitudinal direction 104. A total of 28 carrier elements 102 are screw-fitted to the distributor element 103. Each of the carrier elements 102 is individually replaceable. Furthermore, each of the carrier elements 102 supports a light-emitting semiconductor component 101, more specifically an LED module 101. The light source 100 furthermore has a connector 107 for a cooling fluid inflow, and a connector 108 for a cooling fluid return flow, of a cooling circuit. The connectors 107 and 108 are connected to the distributor element 103 by a connecting element 106. The distributor element 103 is furthermore configured as the housing of the light source 100.

Figure 2:
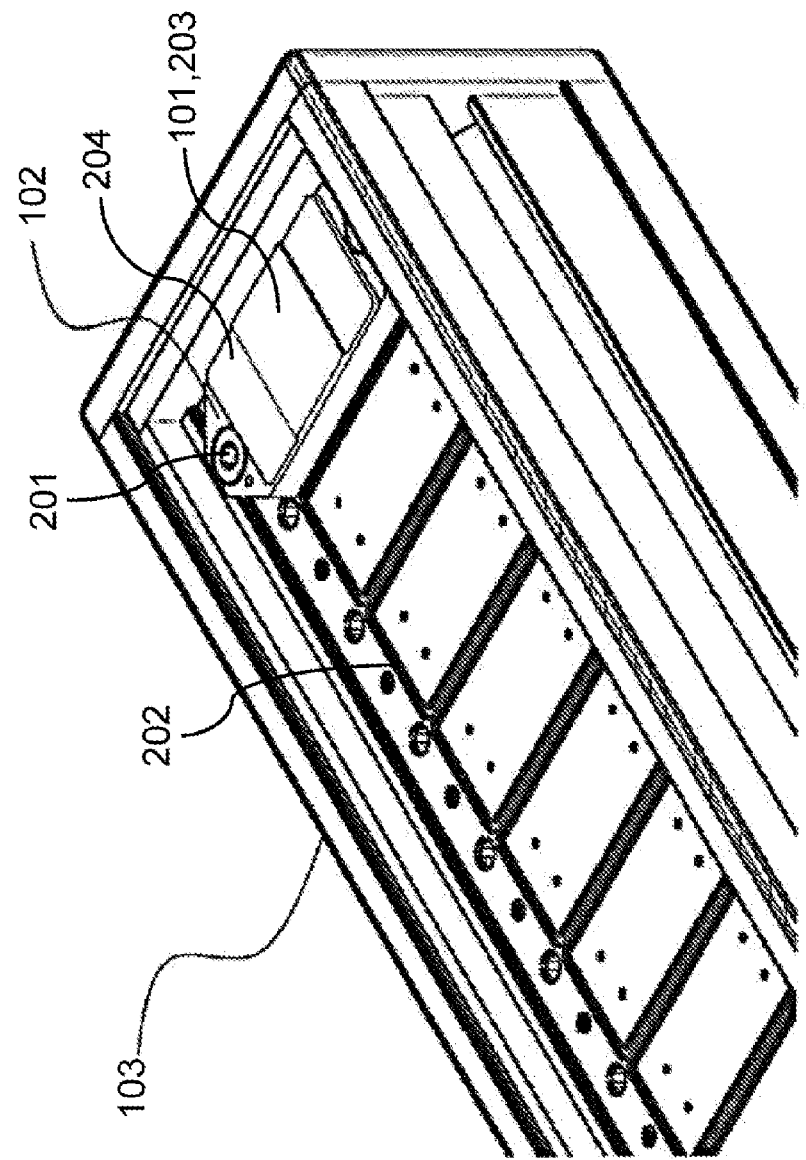
FIG. 2 shows a schematic partial illustration of a fragment of the light source according to the invention of FIG. 1.

FIG. 2 shows a schematic partial illustration of a fragment of the light source 100 according to the invention of FIG. 1. Only one first carrier element 102 of the total of 28 carrier elements 102 of the light source 100 is illustrated in FIG. 2. The first light-emitting semiconductor component 101 which is an LED module 101 is soldered to the first carrier element 102. The first carrier element 102 by way of two countersunk screws as fasteners 201 is screw-fitted to the distributor element 103. Accordingly, the first light-emitting semiconductor component 101, the first carrier element 102, and the distributor element 103 are superimposed on one another in the aforementioned sequence. The LED module 101, as shown, comprises a substrate 204 of a ceramic material on which a plurality of LED chips 203 are mounted by chip-on-board technology. The LED module 101 is a UV-LED module. The distributor element 103 furthermore has one sealing groove 202 for accommodating a sealing element 301 (see FIG. 3) for each of the 28 carrier elements 102, the sealing grooves 202 being beside one another in the longitudinal direction 104.

Figure 3:
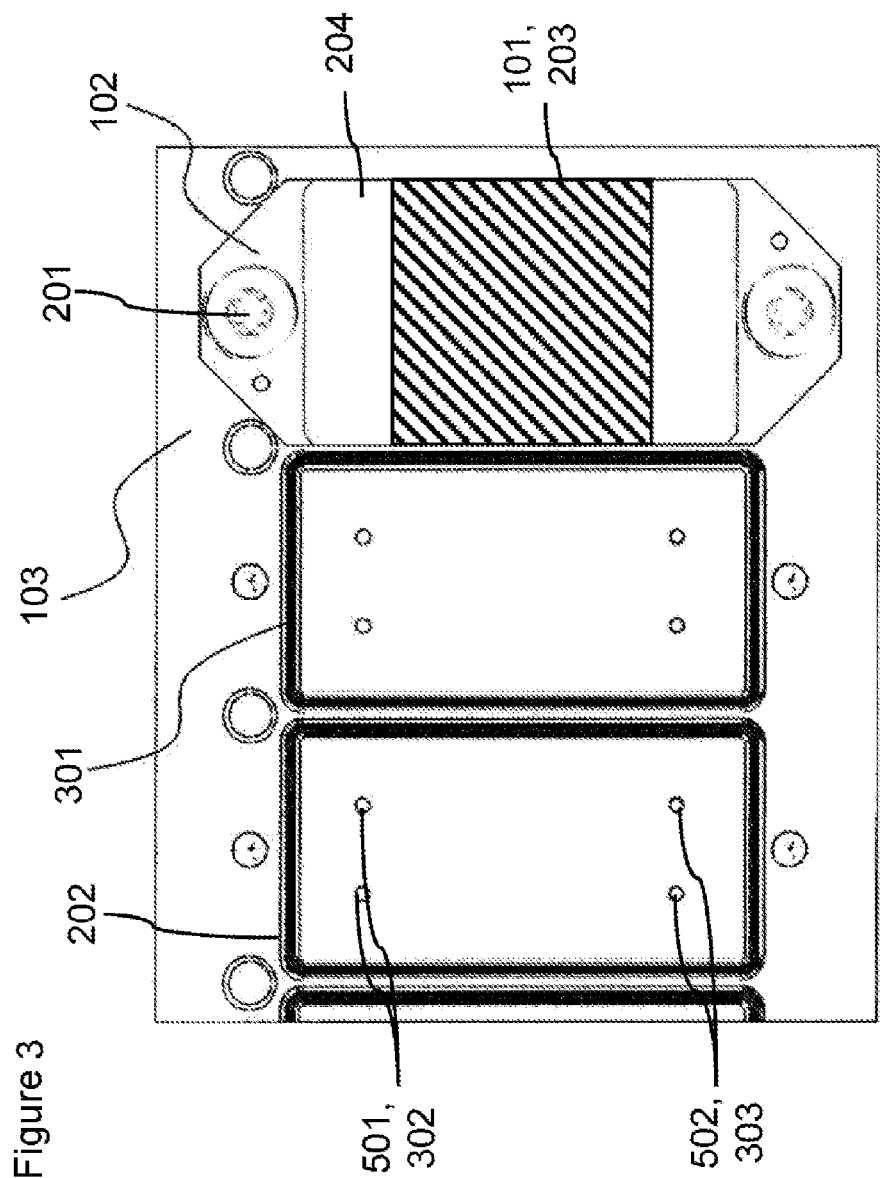
FIG. 3 shows a further schematic partial illustration of a fragment of the light source according to the invention of FIG. 1.

FIG. 3 shows a further schematic partial illustration of a fragment of the light source 100 according to the invention of FIG. 1. As in FIG. 2, here too only the first carrier element 102 of the total of 28 carrier elements 102 of the light source 100 is shown. Furthermore, one sealing element 301 is in each case accommodated in each sealing groove 202. The sealing elements 301 are configured as O-rings with a rectangular shape. In the case of an assembled carrier element 102, a sealing element 301 accommodated in a sealing groove 202, between the carrier element 102 and the distributor element 103, is disposed about a fluidic connection between the carrier element 102 and the distributor element 103 such that the fluidic connection is laterally sealed in a fluid-tight manner. Furthermore in FIG. 3, two third ducts 302 of a first cavity 501 in the distributor element 103 and two third ducts 303 of a further cavity 502 in the distributor element 103 can be seen for each assembly spot of a further carrier element 102 (not illustrated). The first cavity 501 and the further cavity 502 will be explained below in the context of FIG. 5.

Figure 4:
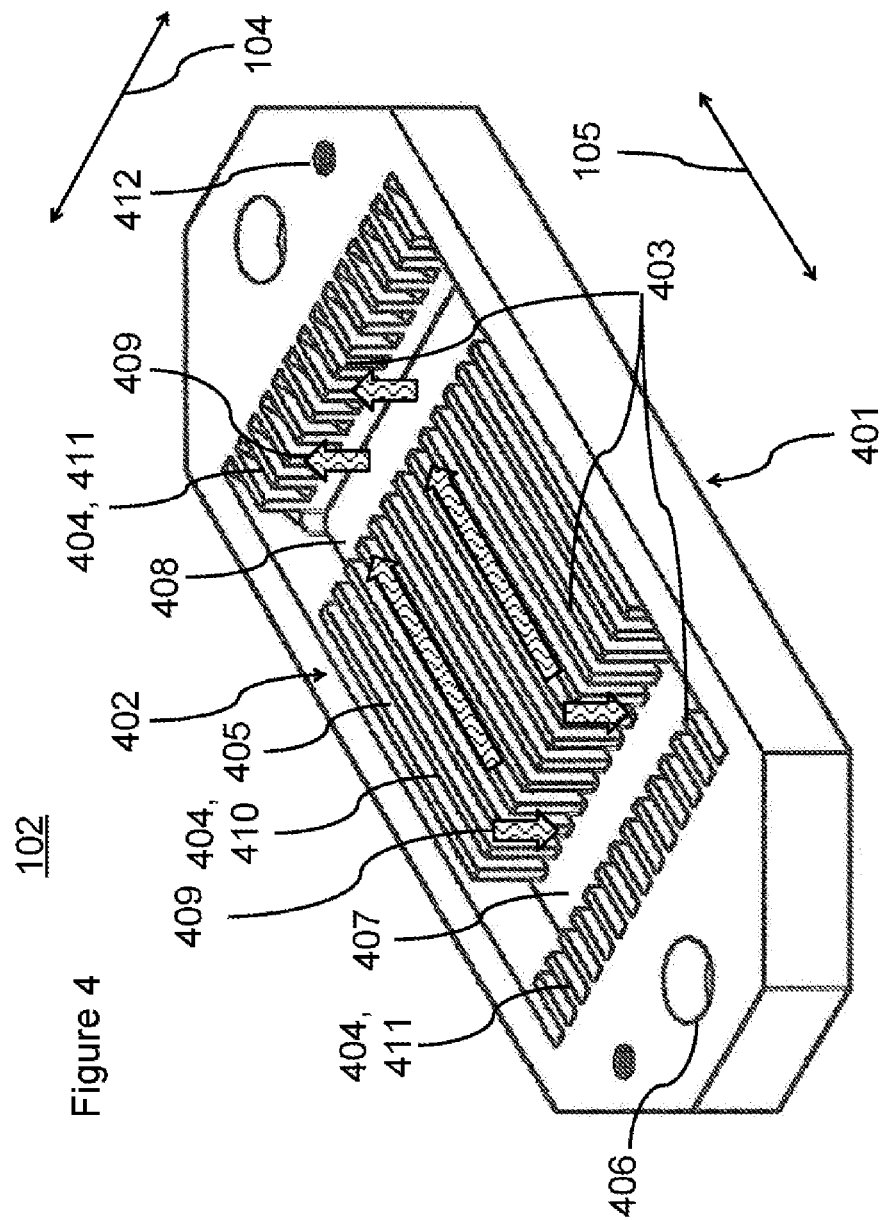
FIG. 4 shows a schematic illustration of the first carrier element of the light source according to the invention of FIG. 1.

FIG. 4 shows a schematic illustration of the first carrier element 102 of the light source 100 according to the invention of FIG. 1. The first carrier element 102 has the external dimensions 59.5 mm×24.3 mm×5 mm. The first carrier element 102 is composed of a main body of copper with the material specification Cu-ETP R250 and the material reference number CW004A. A nickel layer with a thickness of 3 to 7 μm is applied to this main body. A gold layer with a thickness of 0.03 to 0.13 μm is in turn coated on the nickel layer. The two coatings are coatings which in the technical field are referred to as electroless nickel immersion gold (ENIG) which serve in particular for protecting the surface and moreover facilitate an application of the LED module 101 to a carrier surface 401 of planar configuration of the first carrier element 102 (in the figure on the obscured lower side of the first carrier element 102). The first carrier element 102 furthermore has an external surface which is opposite the carrier surface 401 and is referred to as the cooling surface 402. This cooling surface 402 is in part a surface of a cooling structure 403 which is composed of 13 cooling ribs 404 and 14 ducts 405. With the exception of the two outermost ducts 405, the ducts 405 are routed between two respective neighboring cooling ribs 404. Each of the cooling ribs 404 has a thickness of 0.65 mm. A width of the ducts 405 is approximately 0.82 mm. The cooling ribs 404 have in each case two interruptions. A distribution chamber 407 forms in each case one interruption of the cooling ribs 404, while a collection chamber 408 forms the second interruption of each cooling rib 404. A thickness of the first carrier element 102 is at the minimum in the ducts 405, in the distribution chamber 407, and in the collection chamber 408. This minimum thickness is 1 mm. This material thickness imparts to the first carrier element 102 a sufficient mechanical stability for the assembly of the LED module 101 using adhesive bonding, soldering or sintering. Furthermore, the first carrier element 102 having this material thickness is sufficiently stable mechanically so as to not be damaged in the event of usual pressure shocks in the cooling circuit.

Furthermore, a sufficient discharge of heat by the first carrier element 102 to a cooling fluid can be achieved by way of the chosen material thickness. The cooling fluid can flow along a first fluid path 409 which is indicated by arrows in the figure. This first fluid path 409 fluidically connects the first cavity 501 and the further cavity 502 of the distributor element 103 to one another (see FIG. 5). The first fluid path 409, emanating from the first cavity 501 of the distributor element 103 (not shown here), leads into the distribution chamber 407, by way of the 14 ducts 405 into the collection chamber 408, and from there into the further cavity 502 of the distributor element 103 (not shown here). Accordingly, the cooling surface 402 partially delimits the first fluid path 409. The distribution chamber 407 is disposed and configured for distributing the cooling fluid which flows along the first fluid path 409 to the ducts 405. In a manner analogous thereto, the collection chamber 408 is disposed and configured for directing the cooling fluid which flows out of the ducts 405 into the further cavity 502. Each of the cooling ribs 404 is composed of a first portion 410 and two further portions 411. The portions 410, 411 are in each case separated from one another by interruptions in the form of the distribution chamber 407 or the collection chamber 408. The first portions 410 but not the further portions 411 are situated in the first fluid path 409. Nevertheless, the further portions 411 contribute toward a positive distribution of the cooling fluid and thus toward homogeneous cooling of the first carrier element 102. A height of the cooling ribs 404 in the first portions 410 is constant. A height of the cooling ribs 404 in the further portions 411 decreases toward the outside in the transverse direction 105, thus in a direction which is perpendicular to the thicknesses and heights of the cooling ribs 404 and directed away from the first portions 410. The reason for this is that a depth of the ducts 405 in the further portions 411 decreases toward the outside in the transverse direction 105. The first carrier element 102 furthermore has through-hole threads 412. These through-hole threads 412 are preferably M2 threads and can be used for fastening add-on parts such as mountings for optics, or else for fastening assembly aids, for example a protective cap for the LED module 101. The above-mentioned countersunk screws for releasably fastening the first carrier element 102 to the distributor element 103 can be guided through one or more through holes 406. Each further carrier element 102 of the 28 carrier elements 102 of the light source 100 is configured like the previously described first carrier element 102.

Figure 5:
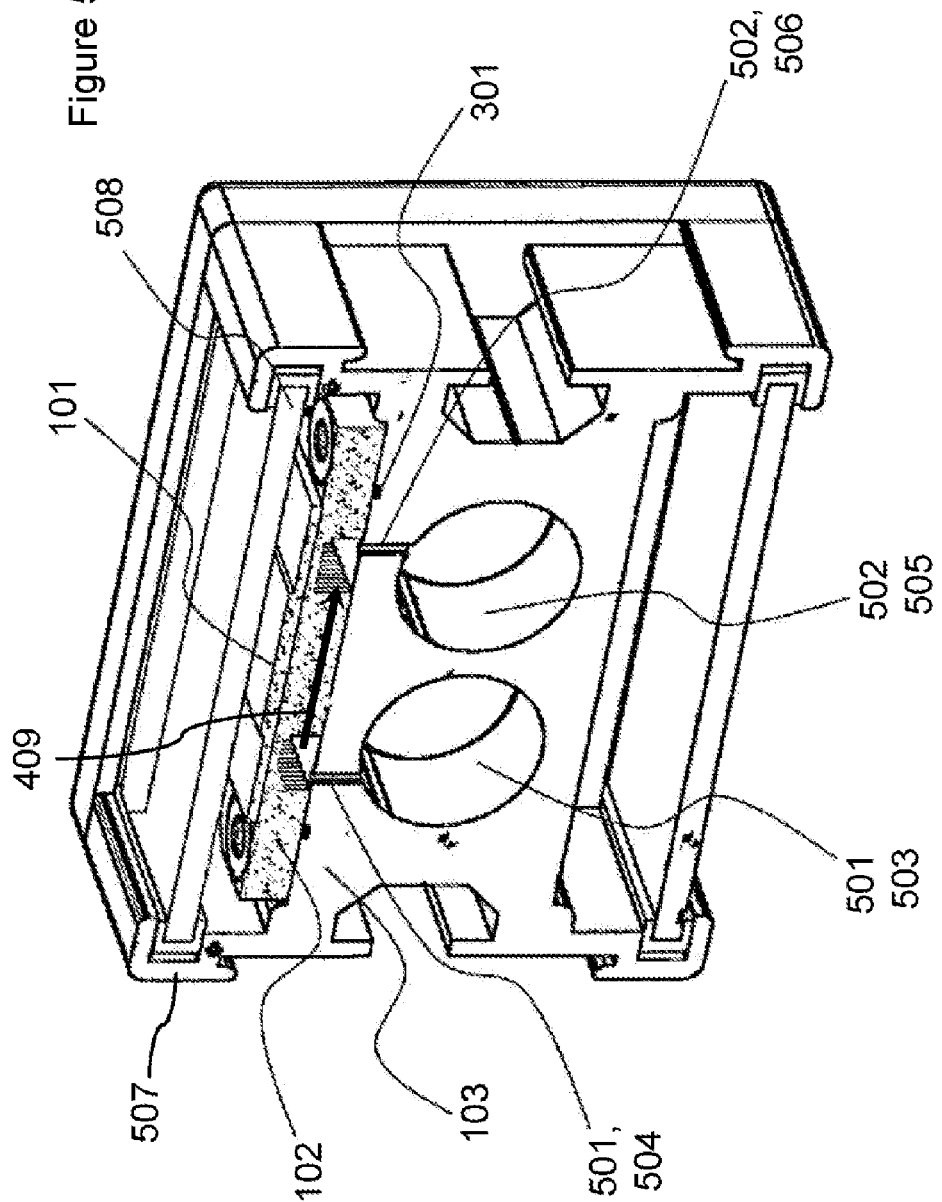
FIG. 5 shows a schematic cross-sectional illustration of the light source according to the invention of FIG. 1.

FIG. 5 shows a schematic cross-sectional illustration of the light source 100 according to the invention of FIG. 1. It can be seen that the distributor element 103 comprises a first cavity 501 which is configured as an inflow for the cooling fluid. The first cavity 501 comprises a first duct 503 which is routed through below each of the carrier elements 102. Two second ducts 504 of the first cavity 501 are routed from the first duct 503 into the first fluid path 409. For each further carrier element 102, two third ducts 302 of the first cavity 501 lead in each case into a further fluid path, thus to the cooling surface 402 of the respective carrier element 102 (see FIG. 3). The distributor element 103 furthermore comprises a further cavity 502 which is configured as a return flow for the cooling fluid. The further cavity 502 comprises a first duct 505 which is routed through below each of the 28 carrier elements 102. Two second ducts 506 of the further cavity 502 lead from the first fluid path 409 into the first duct 505 of the further cavity 502. For each further carrier element 102, two third ducts 303 of the further cavity 502 lead in each case from a further fluid path, thus from the cooling surface 402 of the respective further carrier element 102, into the first duct 505 (see FIG. 3). Accordingly, the first cavity 501 and the further cavity 502 are fluidically connected to one another by the first fluid path 409 and each further fluid path. It can furthermore be seen in FIG. 5 that the first fluid path 409, indicated by an arrow in the figure, is delimited by the cooling surface 402 and an opposite external surface of the distributor element 103. The first sealing element 301 which for sealing is disposed between the first carrier element 102 and the distributor element 103 can furthermore be seen. The distributor element 103 in terms of the function thereof as a housing furthermore has a mounting 507 which is disposed and configured for holding an emission window 508 of the light source 100.

Figure 6:
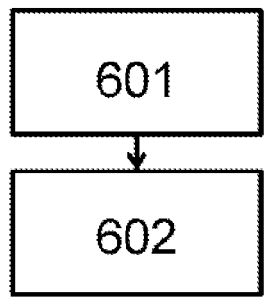
FIG. 6 shows a flow chart of a method according to the invention for producing a light source.

FIG. 6 shows a flow chart of a method 600 according to the invention for producing a light source 100. In a method step A} 601, 28 carrier elements 102 are provided which are configured like the first carrier element 102 shown in FIG. 4 are provided. One LED module 101 is applied to the carrier surface 401 of each of these carrier elements 102. Furthermore provided in this method step A} 601 is the distributor element 103 shown in FIG. 5. In a method step B} 602, the carrier elements 102 are in each case releasably screw-fitted to the distributor element 103 by two countersunk screws such that the first cavity 501 and the further cavity 502 of the distributor element 103 for each carrier element 102 are fluidically connected to one another by a fluid path 409. Each of the fluid paths 409 is delimited by a surface of the distributor element 103 and by a cooling surface 402 of the respective carrier element 102. The providing of the distributor element 103 comprises an extrusion while obtaining a formed aluminum body into which the second ducts 504 and 506, and the third ducts 302 and 303, are incorporated by drilling. The providing of each of the carrier elements 102 takes place by providing a formed copper body, machining this copper formed body, inter alia with a CNC milling machine, and coating the machined copper formed body with the ENIG coatings. The machining with the CNC milling machine comprises milling with a disk cutter. The latter has 14 disk-shaped cutting blades which have in each case a diameter of 27.7 mm and a thickness of 0.82 mm. Using this disk cutter, all 14 ducts 405, and thus the cooling ribs 404 of the cooling structure 403 of the carrier element 102, can be simultaneously generated. The distribution chamber 407 and the collection chamber 408 are subsequently incorporated using an end milling cutter, and the cooling ribs 404 are thus subdivided into the first portions 410 and further portions 411. Furthermore, the through holes 406 are drilled and the through-hole threads 412 are drilled and cut. The light source 100 of FIG. 1 is produced by the method 600. The method 600 is distinguished by a short production time, a stable process management (minor production tolerances) and low wear on the tools, in particular in the production of the carrier elements 102. Furthermore, the copper of the carrier elements 102 can be readily machined using the tools mentioned.

Figure 7:
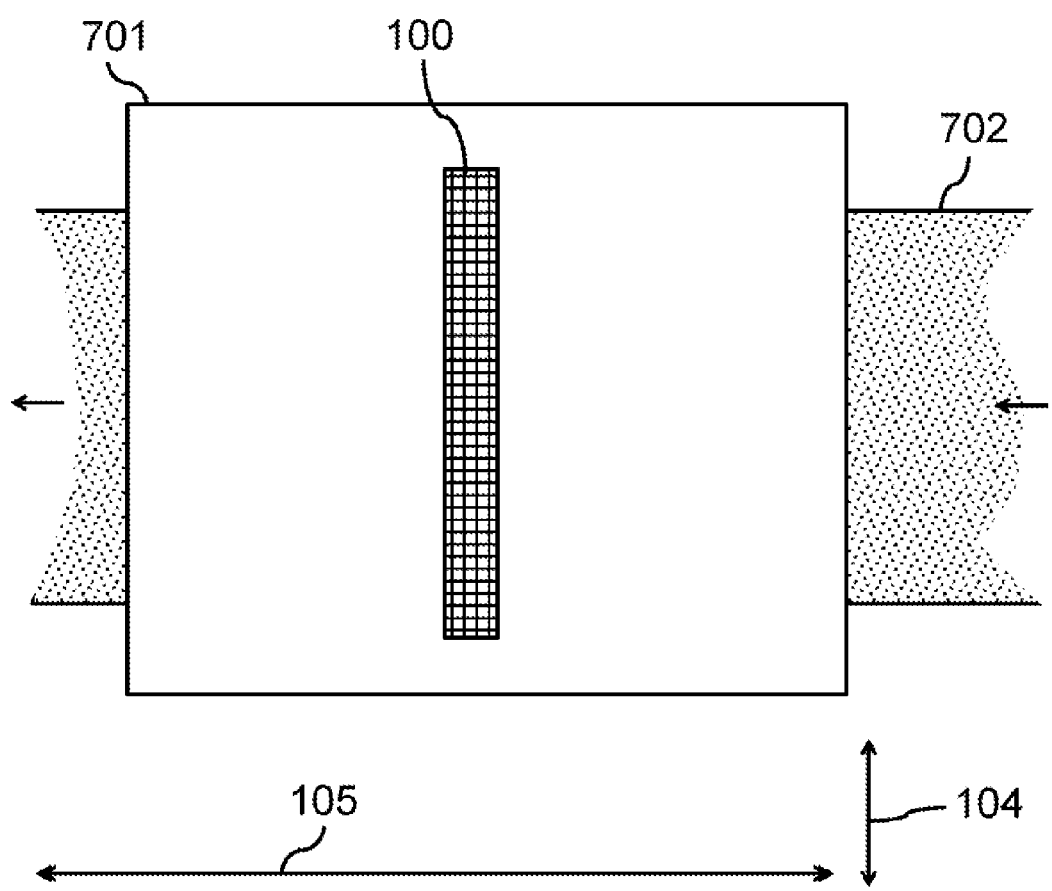
FIG. 7 shows a schematic illustration of a printing machine according to the invention.

FIG. 7 shows a schematic illustration of a printing machine 701 according to the invention. The printing machine 701 comprises the light source 100 of FIG. 1. The light source 100 in the printing machine 701 is disposed for irradiating a composition which is printed on a print medium 702. The printing machine 701 is a sheet-fed offset printing machine.

Figure 8:
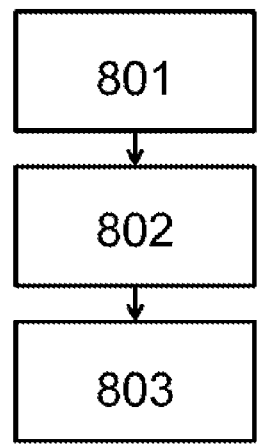
FIG. 8 shows a flow chart of a method according to the invention for producing a printed product.
Figure 9:
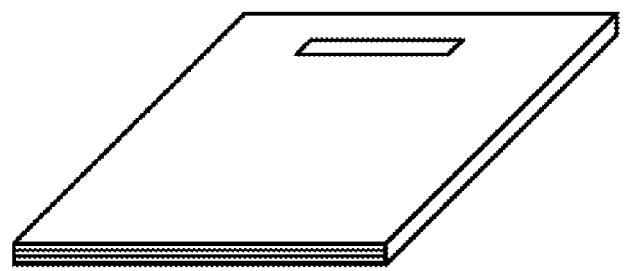
FIG. 9 shows a schematic illustration of a printed product according to the invention.

FIG. 8 shows a flow chart of a method 800 according to the invention for producing a printed product 900 (see FIG. 9). In a method step A) 801, the printing machine 701 of FIG. 7 and a print medium 1002 as an object 1002 are provided (see FIG. 10). In a subsequent method step B) 802, a liquid composition 1003, which is a sheet-fed offset printing ink, is printed on the print medium 1002 by the printing machine 701. In a method step C) 803, the printed sheet-fed offset printing ink is irradiated with UV light emitted by the LED modules 101 of the light source 100 and in this way cured by polymerization. As a result of the construction of the light source 100 according to the invention, each of the 28 carrier elements 102 of the light source 100 in the method step C) 803 can be cooled at a cooling output of approximately 300 W by a water/glycol mixture as a cooling fluid which flows into a cooling circuit at approximately 5 bar, so that the two carrier elements 102 that are farthest apart in the longitudinal direction 104 have a temperature differential of at most 4 K. As a result, all LED modules 101 of the light source 100 can be operated at an approximately identical efficiency, this enabling homogeneous irradiating and thus homogeneous curing of the printing ink 1003 across a large area.

FIG. 9 shows a schematic illustration of the printed product 900 according to the invention. Depicted is a brochure 900 which is obtainable by the method 800 of FIG. 8.

Figure 10:
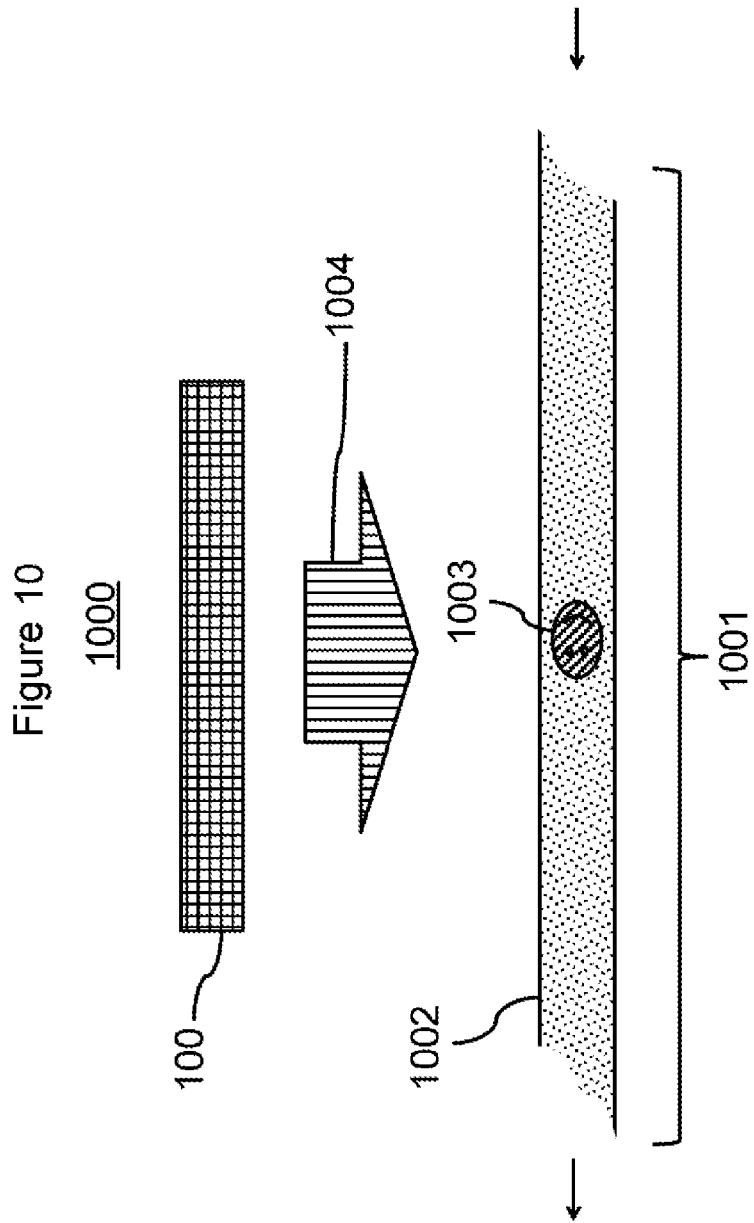
FIG. 10 shows a schematic illustration of an assembly according to the invention.

FIG. 10 shows a schematic illustration of an assembly 1000 according to the invention. The assembly 1000 comprises the printing machine 701 of FIG. 7 and a material to be irradiated 1001 which is composed of the object 1002, here the print medium 1002, and a printing ink 1003 which is printed on the print medium 1002. The light source 100 of the printing machine 701 and the material to be irradiated 1001 are disposed such that the printed printing ink 1003 can be irradiated with light 1004, here UV light, which is emitted by the LED modules 101 of the light source 100.

Figure 11:
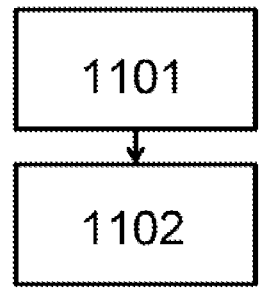
FIG. 11 shows a flow chart of a method according to the invention for irradiating a material to be irradiated.

FIG. 11 shows a flow chart of a method 1100 according to the invention for irradiating a material to be irradiated 1001. In a method step A] 1101, the assembly 1000 of FIG. 10 is provided. In a method step B] 1102, the material to be irradiated 1001 is irradiated with UV light emitted by the LED modules 101 of the light source 100.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure. It is expressly intended, for example, that all ranges broadly recited in this document include within their scope all narrower ranges which fall within the broader ranges.

The invention claimed is:

1. A light source comprising as components which superimpose one another in this sequence:
   at least one first light-emitting semiconductor component;
   at least one second light-emitting semiconductor component;
   a plurality of carrier elements, wherein a first carrier element of the plurality of carrier elements comprises a first carrier surface which faces the at least one first light-emitting semiconductor component and a first cooling surface, and a second carrier element of the plurality of carrier elements comprises a second carrier surface which faces the at least one second light-emitting semiconductor component; and
   a distributor element comprising a first cavity to provide inflow of a fluid and a further cavity to provide return flow of the fluid,
   wherein:
   the first cavity and the further cavity are fluidically connected to one another by a first fluid path, the first carrier surface and the first cooling surface are mutually opposite external surfaces of the first carrier element, and the first carrier element has a cooling structure with a surface and the first cooling surface is at least in part the surface of the cooling structure of the first carrier element, and the cooling structure comprises cooling ribs, wherein the distributor element has an external surface that faces the first cooling surface, and the first fluid path is at least in part additionally delimited by the external surface of the distributor element that faces the first cooling surface.

2. The light source as claimed in claim 1, wherein the first carrier element is releasably connected to the distributor element.

3. A printing machine comprising the light source as claimed in claim 1.

4. A method comprising as method steps:
A) providing the light source as claimed in claim 1 and an object;
B) superimposing the object with a composition; and
C) irradiating the composition with light emitted by the at least one first light-emitting semiconductor component.

5. The method as claimed in claim 4, wherein method step C) comprises curing the composition and the curing comprises a reduction of a proportion of one vehicle in the composition.

6. A printed product made by the method as claimed in claim 5.

7. A printed product made by the method as claimed in claim 4.

8. An assembly comprising:
the light source as claimed in claim 1; and
a material to be irradiated,
wherein the light source and the material to be irradiated are disposed and configured for irradiating the material to be irradiated with light emitted from the at least one first light-emitting semiconductor component.

9. A method comprising as method steps:
A] providing the assembly as claimed in claim 8; and
B] irradiating the material to be irradiated with light emitted by the at least one first light-emitting semiconductor component.

10. The light source as claimed in claim 1, wherein the light source is configured for curing a composition.

11. The light source as claimed in claim 1, wherein the light source is configured for use in a printing machine.

12. The light source as claimed in claim 1, wherein the first carrier element is releasably connected to the distributor element, the first carrier element has a cooling structure with a surface and the first cooling surface is at least in part the surface of the cooling structure of the first carrier element, the first carrier surface and the first cooling surface are mutually opposite external surfaces of the first carrier element, and the distributor element has a surface that faces the first carrier element and the first fluid path is at least in part additionally delimited by the surface of the distributor element that faces the first carrier element.

13. The light source as claimed in claim 1, wherein the at least one first light-emitting semiconductor component is disposed on the first carrier element of the plurality of carrier elements.

14. The light source as claimed in claim 1, wherein each carrier element of the plurality of carrier elements is respectively releasably connected to the distributor element by at least one fastener.

15. A method for producing a light source, the method comprising as method steps:
A} providing
a) at least one first light-emitting semiconductor component,
b) a plurality of carrier elements, wherein a first carrier element of the plurality of carrier elements comprises
i) a first carrier surface, and
ii) a first cooling surface, and
c) a distributor element comprising
i) a first cavity to provide inflow of a fluid, and
ii) a further cavity to provide return flow of the fluid; and
B} releasably connecting the first carrier element to the distributor element such that the first cavity and the further cavity are fluidically connected to one another by a first fluid path, wherein:
the at least one first light-emitting semiconductor component is superimposed on the first carrier element on a side of the first carrier surface,
the first carrier surface and the first cooling surface are mutually opposite external surfaces of the first carrier element,
the first carrier element has a cooling structure with a surface and the first cooling surface is at least in part the surface of the cooling structure of the first carrier element, and
the cooling structure comprises cooling ribs,
wherein the distributor element has an external surface that faces the first cooling surface, and the first fluid path is at least in part additionally delimited by the external surface of the distributor element that faces the first cooling surface.

16. The method as claimed in claim 15, wherein in method step A}, the providing of the first carrier element comprises generating the cooling structure using a disk cutter.

17. The light source made by the method as claimed in claim 16.

18. The light source made by the method as claimed in claim 15.

* * * * *